United States Patent
Lee et al.

(10) Patent No.: US 9,123,594 B2
(45) Date of Patent: Sep. 1, 2015

(54) ORGANIC LIGHT-EMITTING DISPLAY APPARATUS HAVING HIGH APERTURE RATIO

(75) Inventors: Yul-Kyu Lee, Yongin (KR); Chun-Gi You, Yongin (KR); Sun Park, Yongin (KR); Jong-Hyun Park, Yongin (KR); Sang-Ho Moon, Yongin (KR); Na-Young Kim, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 196 days.

(21) Appl. No.: 13/208,163

(22) Filed: Aug. 11, 2011

(65) Prior Publication Data

US 2012/0146004 A1    Jun. 14, 2012

(30) Foreign Application Priority Data

Dec. 14, 2010   (KR) .................. 10-2010-0127856

(51) Int. Cl.

| H01L 29/08 | (2006.01) |
|---|---|
| H01L 35/24 | (2006.01) |
| H01L 51/00 | (2006.01) |
| H01L 27/12 | (2006.01) |
| H01L 27/32 | (2006.01) |
| H01L 29/786 | (2006.01) |

(52) U.S. Cl.
CPC .......... *H01L 27/1255* (2013.01); *H01L 27/326* (2013.01); *H01L 27/3265* (2013.01); *H01L 29/78645* (2013.01); *H01L 29/78696* (2013.01); *H01L 2227/323* (2013.01)

(58) Field of Classification Search
CPC ....................................... H01L 33/42
USPC ........ 257/40, 59, 69, 72; 438/155; 315/169.3; 349/39, 69, 114
See application file for complete search history.

(56) References Cited

U.S. PATENT DOCUMENTS

| 5,668,379 | A * | 9/1997 | Ono et al. ................ 257/59 |
|---|---|---|---|
| 7,830,476 | B2 * | 11/2010 | Park ........................ 349/69 |
| 2005/0236981 | A1 * | 10/2005 | Cok et al. ................ 313/504 |
| 2005/0258466 | A1 | 11/2005 | Kwak et al. |

(Continued)

FOREIGN PATENT DOCUMENTS

| JP | 2007-52422 | 3/2007 |
|---|---|---|
| KR | 10-2005-0113693 | 12/2005 |

(Continued)

*Primary Examiner* — Shaun Campbell
*Assistant Examiner* — Ismail Muse
(74) *Attorney, Agent, or Firm* — Robert E. Bushnell, Esq.

(57) ABSTRACT

In an organic light-emitting display apparatus and a method of manufacturing the same, the organic light-emitting display apparatus comprises: at least one transistor, each including a semiconductor layer, a gate electrode, and source and drain electrodes; a first capacitor including a first electrode formed on the same plane as the semiconductor layer, a second electrode formed on the same plane as the gate electrode, and a third electrode formed on the same plane as the source and drain electrodes; a second capacitor including a first electrode formed on the same plane as the semiconductor layer and comprising ion impurities, and a second electrode formed on the same plane as the gate electrode; a pixel electrode formed on the same plane as the gate electrode and electrically connected to the transistor; a light-emitting layer disposed on the pixel electrode; and an opposite electrode disposed on the light-emitting layer and facing the pixel electrode.

14 Claims, 10 Drawing Sheets

(56) References Cited

U.S. PATENT DOCUMENTS

| | | |
|---|---|---|
| 2007/0040770 A1 | 2/2007 | Kim |
| 2008/0246026 A1* | 10/2008 | Kim ................................ 257/40 |
| 2008/0315189 A1* | 12/2008 | Lee et al. ........................ 257/40 |
| 2009/0278131 A1* | 11/2009 | Kwon et al. .................... 257/72 |
| 2010/0013383 A1 | 1/2010 | Kim et al. |
| 2010/0193790 A1* | 8/2010 | Yeo et al. ........................ 257/59 |
| 2011/0140107 A1* | 6/2011 | Kang et al. ...................... 257/57 |

FOREIGN PATENT DOCUMENTS

| | | |
|---|---|---|
| KR | 10-2010-0054433 | 5/2010 |
| KR | 10-2010-0088269 | 8/2010 |

* cited by examiner

ORGANIC LIGHT-EMITTING DISPLAY APPARATUS HAVING HIGH APERTURE RATIO

CLAIM OF PRIORITY

This application makes reference to, incorporates the same herein, and claims all benefits accruing under 35 U.S.C. §119 from an application earlier filed in the Korean Intellectual Property Office on Dec. 14, 2010 and there duly assigned Serial No. 10-2010-0127856.

BACKGROUND OF THE INVENTION

1. Field of the Invention

The present invention relates to an organic light-emitting display apparatus and a method of manufacturing the same.

2. Description of the Related Art

Organic light-emitting display apparatuses can be manufactured as lightweight and thin apparatuses, and also have wide viewing angles, short response speeds, and low power consumption. Due to these advantages, they are getting attention as next generation display apparatuses.

SUMMARY OF THE INVENTION

The present invention provides an organic light-emitting display apparatus, the manufacturing process of which is simple, and which has a high aperture ratio, and a method of manufacturing the same.

According to an aspect of the present invention, an organic light-emitting display apparatus comprises: at least one transistor, each including a semiconductor layer, a gate electrode, and source and drain electrodes; a first capacitor including a first electrode formed on the same plane as the semiconductor layer, a second electrode formed on the same plane as the gate electrode, and a third electrode formed on the same plane as the source and drain electrodes; a second capacitor including a first electrode formed on the same plane as the semiconductor layer and which includes ion impurities, and a second electrode formed on the same plane as the gate electrode; a pixel electrode formed on the same plane as the gate electrode and electrically connected to the transistor; a light-emitting layer disposed on the pixel electrode; and an opposite electrode disposed on the light-emitting layer and facing the pixel electrode.

The first capacitor may be connected to a power source voltage supply line for supplying a power source voltage to the transistor, and the first capacitor and the power source voltage supply line overlap each other.

The transistor may be a driving transistor, and the first capacitor is a storage capacitor for applying a voltage to the driving transistor.

The first electrode of the first capacitor may include a semiconductor which is not doped with ion impurities.

The first electrode and the third electrode of the first capacitor may be connected to each other through a contact hole.

The first capacitor may have a first electrostatic capacity between the first electrode and the second electrode and a second electrostatic capacity between the second electrode and the third electrode, wherein the first electrostatic capacity and the second electrostatic capacity are connected in parallel.

The second electrode of the first capacitor may include the same material as used to form the gate electrode.

The third electrode of the first capacitor may include the same material as used to form the source and drain electrodes.

The third electrode of the first capacitor may include a power source voltage supply line for supplying a power source voltage to the transistor.

The second capacitor is a compensation capacitor which is connected to a gate terminal of a driving transistor.

The second electrode of the second capacitor may include a transparent conductive material.

The gate electrode may comprise a first layer including a transparent conductive material and a second layer including metal.

The pixel electrode may include the same transparent conductive material as used to form the gate electrode.

The semiconductor layer may include amorphous silicon or poly silicon.

The opposite electrode may be a reflective electrode which reflects light emitted from the light-emitting layer.

According to another aspect of the present invention, a method of manufacturing an organic light-emitting display apparatus comprises: performing a first mask process in which a semiconductor layer is formed on a substrate and the semiconductor layer is patterned to form a semiconductor layer of a transistor, a first electrode of a first capacitor, and a first electrode of a second capacitor; performing a second mask process in which a first insulating layer is formed on the resultant structure of the first mask process, and a transparent conductive material and a first metal are sequentially deposited on the first insulating layer and are patterned to form a gate electrode of the transistor, a pixel electrode, a second electrode of the first capacitor, and a second electrode of the second capacitor; performing a third mask process in which a second insulating layer is formed on the resultant structure of the second mask process, and contact holes are formed for exposing portions of source and the drain regions of the semiconductor layer, the pixel electrode, a portion of the first electrode of the first capacitor, and the second electrode of the second capacitor; performing a fourth mask process in which a second metal is deposited on the resultant structure of the third mask process, and the second metal is patterned to form source and drain electrodes contacting the source and the drain regions, respectively, and a third electrode of the first capacitor; and performing a fifth mask process in which a third insulating layer is formed on the resultant structure of the fourth mask process, and an opening exposing a transparent conductive material included in the pixel electrode is formed on the third insulating layer.

The source and drain regions may be doped with ion impurities after the second mask process is performed.

The fourth mask process may include a first etching process for removing the second metal deposited on the pixel electrode and the second electrode of the second capacitor, and a second etching process for removing the first metal deposited on the pixel electrode and the transparent conductive material of the second capacitor.

In the fourth mask process, the second metal and the first metal may be the same material, and the first metal and second metal are simultaneously etched.

The first electrode of the second capacitor may be doped with ion impurities after the fourth mask process is performed.

A light-emitting layer and an opposite electrode may be further formed on the pixel electrode after the fifth mask process is performed.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Hereinafter, one or more embodiments of the present invention will be described in detail with reference to the attached drawings.

Figure 1:
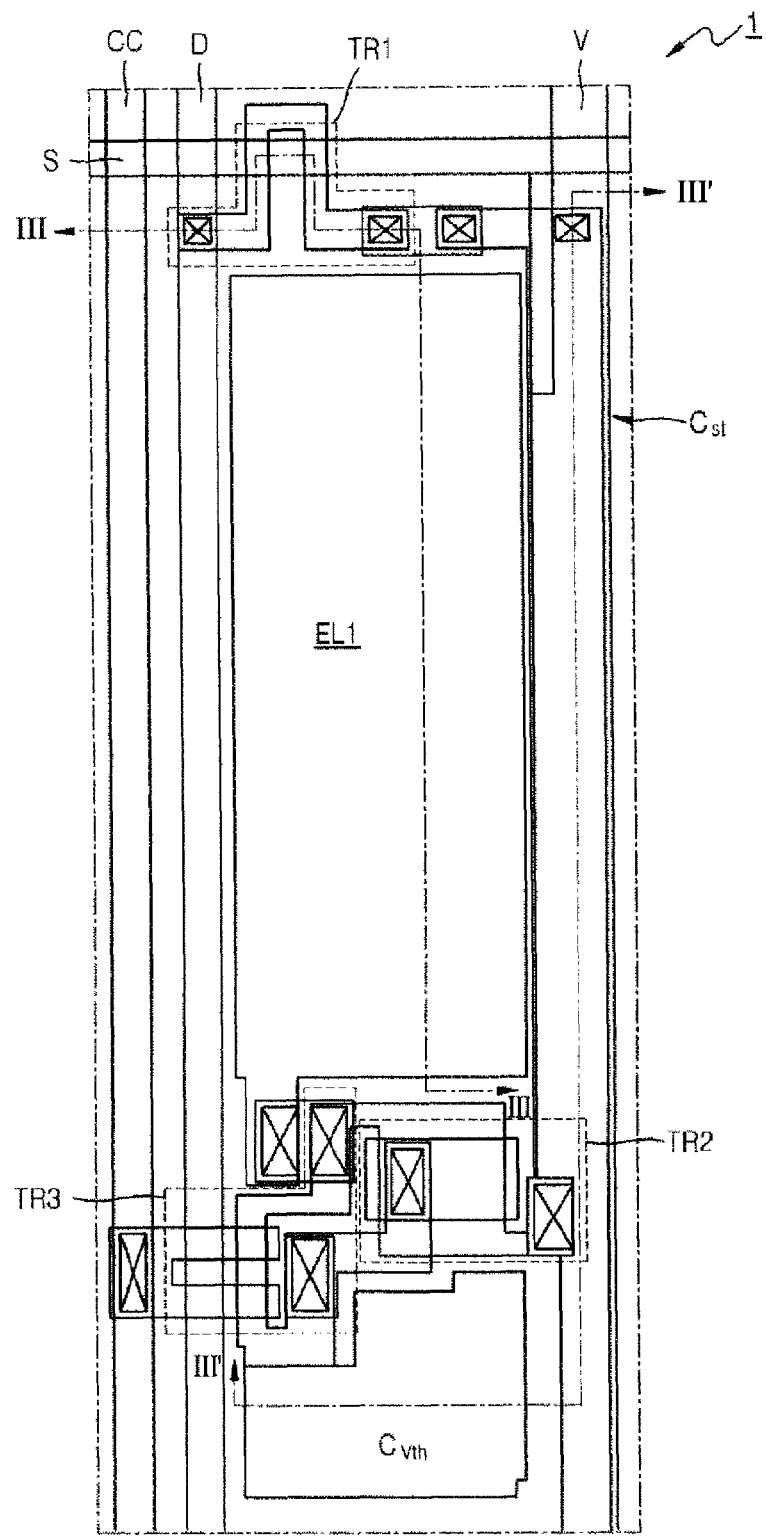
FIG. 1 is a schematic plan view of a pixel included in an organic light-emitting display apparatus according to an embodiment of the present invention.
Figure 2:
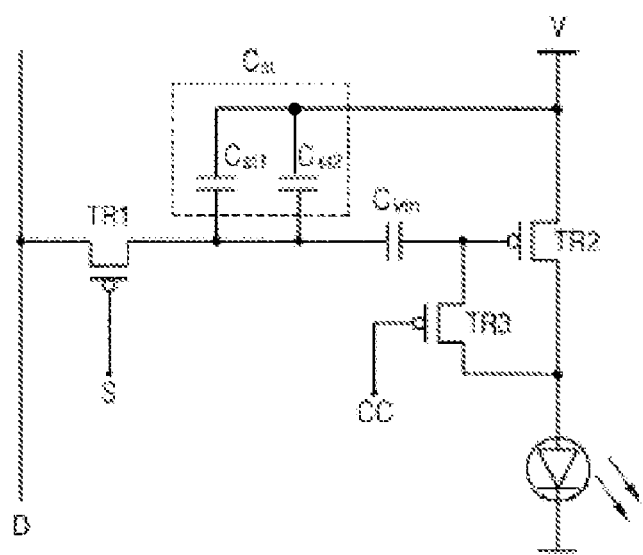
FIG. 2 is a circuit diagram of the organic light-emitting display apparatus of FIG. 1.
Figure 3A:
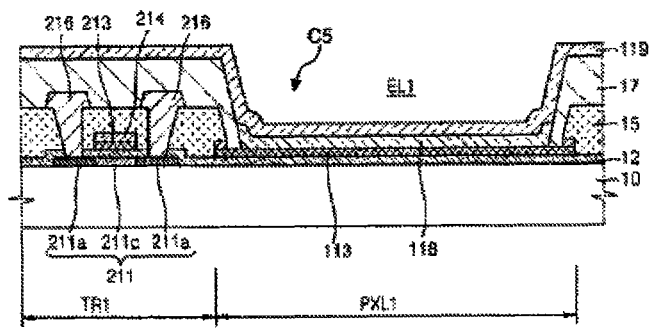
FIG. 3A is a cross-sectional view taken along a line III-III of FIG. 1.
Figure 3B:
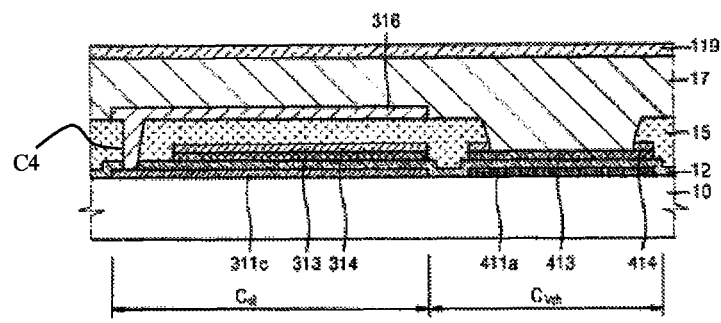
FIG. 3B is a cross-sectional view taken along a line III'-III' of FIG. 1.

FIG. 1 is a schematic plan view of a pixel included in an organic light-emitting display apparatus according to an embodiment of the present invention, FIG. 2 is a circuit diagram of the organic light-emitting display apparatus of FIG. 1, FIG. 3A is a cross-sectional view taken along a line III-III of FIG. 1, and FIG. 3B is a cross-sectional view taken along a line III'-III' of FIG. 1.

Referring to FIG. 1, the pixel included in the organic light-emitting display apparatus 1 according to the present embodiment comprises a plurality of conductive lines including a scan line S, a data line D, a power source voltage supply line V, and a /compensation control signal line CC, a pixel unit including a light-emitting region EL1, first thru third thin film transistors (TFTs) TR1, TR2 and TR3, a first capacitor Cst, and a second capacitor Cvth.

The organic light-emitting display apparatus of FIG. 1 is exemplary and the present invention is not limited thereto. That is, besides the conductive lines illustrated in FIG. 1, the organic light-emitting display apparatus may further include other conductive lines. Also, some of the conductive lines, for example, the compensation control signal line CC, may not be included in each pixel. For example, adjacent pixels may commonly share the same compensation control signal line CC. Also, the number of the TFTs and the number of capacitors are not limited thereto. For example, according to a pixel circuit unit, three or more TFTs and two or more capacitors may be used in combination.

Referring to FIG. 2, a gate electrode of the first TFT TR1 is connected to the scan line S, and a first electrode of the first TFT TR1 is connected to the data line D. A gate electrode of the second TFT TR2 is connected to a second electrode of the first TFT TR1 through the second capacitor Cvth, a first electrode of the second TFT TR2 is connected to the power source voltage supply line V, and a second electrode of the second TFT TR2 is connected to an anode of a light-emitting region EL. A gate electrode of the third TFT TR3 is connected to the compensation control signal line CC, a first electrode of the third TFT TR3 is connected to the gate electrode of the second TFT TR2, and a second electrode of the third TFT TR3 is connected to the second electrode of the second TFT TR2. In this case, the first TFT TR1 acts as a switching transistor, the second TFT TR2 acts as a driving transistor, and a third TFT TR3 acts as a compensation transistor for compensating for a threshold voltage Vth. The first TFT TR1, the second TFT TR2 and the third TFT TR3 illustrated in FIG. 2 are P-type TFTs, but are not limited thereto. For example, at least one of the first TFT TR1, the second TFT TR2 and the third TFT TR3 may be an N-type TFT.

The first capacitor Cst is connected between the second electrode of the first TFT TR1 and the power source voltage supply line V. The first capacitor Cst includes capacitors Cst1 and Cst2 connected in parallel. The second capacitor Cvth is connected between the second electrode of the first TFT TR1 and the gate electrode of the second TFT TR2. The first capacitor Cst may act as a storage capacitor for storing data signals when the data signals are applied to the first TFT TR1, and the second capacitor Cvth may act as a compensation capacitor for compensating for an irregularity of a threshold voltage Vth.

Referring to FIG. 3A, the first TFT TR1 includes a semiconductor layer 211 disposed on the substrate 10, gate electrodes 213 and 214, and source and drain electrodes 216. FIG. 3A illustrates only a cross-section of the first TFT TR1, and the second TFT TR2 and the third TFT TR3 have the same cross section as the first TFT TR1.

The substrate 10 may be formed of various materials, for example, glass or plastic. If the organic light-emitting display apparatus is a bottom emission type display apparatus and an image is formed toward the substrate 10, the substrate 10 may be formed of a transparent material.

Although not illustrated in FIG. 3A, a buffer layer (not shown) may be further formed on the substrate 10 to form an even surface and to prevent permeation of impurity elements into layers above the substrate 10. The buffer layer may include $SiO_2$ and/or SiNx.

The semiconductor layer 211 may be formed of amorphous silicon or poly silicon, and may include a channel region 211c, and source and drain regions 211a doped with ion impurities disposed outside the channel region 211c. The source and drain regions 211a may include a p-type semiconductor formed by doping with a Group 3 element or an n-type semiconductor formed by doping with a Group 5 element.

The first gate electrode 213 and the second gate electrode 214 are sequentially formed above the portion of semiconductor layer 211 corresponding to the channel region 211c of the semiconductor layer 211. In this case, a first insulating layer 12, which is a gate insulating layer, may be interposed between the first gate electrode 213 and the second gate electrode 214, on one side, and the semiconductor layer 211, on the other side.

The first insulating layer 12 insulates the semiconductor layer 211 from the first and second gate electrodes 213 and 214, respectively, and may be formed as an inorganic layer formed of SiNx and/or $SiO_2$.

The first gate electrode 213 and the second gate electrode 214 may include conductive materials having different etching selectivities. For example, the first gate electrode 213 may include a transparent conductive material such as ITO, and the second gate electrode 214 may include at least one material selected from the group consisting of Ti, Mo, Al, Ag, Cu, and an alloy thereof, as long as the material for the first gate electrode 213 and the material for the second gate electrode 214 have different etching selectivities. In the present embodiment, the first gate electrode 213 includes a transparent conductive material, for example, ITO, and the second gate electrode 214 includes a triple layer formed of Mo/Al/Mo. Meanwhile, besides ITO, the transparent conductive material for forming the first gate electrode 213 may include IZO, ZnO or $In_2O_3$.

A second insulating layer 15 may be disposed on the first and second gate electrodes 213 and 214, respectively. The second insulating layer 15 may act as an interlayer insulating layer for insulating the first and second gate electrodes 213 and 214, respectively, from the source and drain electrodes 216.

The second insulating layer 15 may be formed of various insulating materials. For example, the second insulating layer 15 maybe formed of an organic material or an inorganic material, such as an oxide or a nitride. An inorganic material for forming the second insulating layer 15 may include $SiO_2$, SiNx, SiON, $Al_2O_3$, $TiO_2$, $Ta_2O_5$, $HfO_2$, $ZrO_2$, BST or PZT, and an organic material for forming the second insulating layer 15 may include a generally available polymer, such as PMMA or PS, a polymer derivative having a phenol group, an acryl-based polymer, an imide-based polymer, an aryl ether-based polymer, an amide-based polymer, a fluorine-based polymer, p-xylene-based polymer, a vinyl alcohol-based polymer, or a blend thereof. Also, the second insulating layer 15 may have a composite stack including an inorganic insulating layer and an organic insulating layer.

The source and drain electrodes 216 are connected to the source and drain regions 211a of the semiconductor layer 211. Although in FIG. 3A the source and drain electrodes 216 are illustrated as a single layer, the source and drain electrodes 216 are not limited thereto. For example, the source and drain electrodes 216 may be formed as a plurality of layers.

Referring to FIG. 3A, the pixel unit PXL1 is disposed on the substrate 10. The pixel unit PXL1 includes a first pixel electrode 113, a light-emitting layer 118, and an opposite electrode 119.

The first pixel electrode 113 and the first gate electrode 213 are formed on the same plane, and the first pixel electrode 213 may include the same transparent conductive material as used in the first gate electrode 113. The transparent conductive material for forming the first pixel electrode 213 may include indium tin oxide (ITO), indium zinc oxide (IZO), zinc oxide (ZnO), indium oxide ($In_2O_3$), indium gallium oxide (IGO) or aluminum zinc oxide (AZO).

The light-emitting layer 118 is formed on the first pixel electrode 113, and light emitted from the light-emitting layer 118 propagates toward the substrate 10 through the first pixel electrode 113 formed of a transparent conductive material.

A third insulating layer 17 is formed on the first insulating layer 12 and the first pixel electrode 113, and the third insulating layer 17 has an opening C5 exposing the pixel electrode 113. The light-emitting layer 118 is disposed in the opening C5. According to the light-emitting layer 118, a light-emitting region EL1 is determined.

The light-emitting layer 118 may include a low molecular weight organic material or a polymer organic material. If the light-emitting layer 118 includes a low molecular weight organic material, a hole transport layer (HTL), a hole injection layer (HIL), an electron transport layer (ETL), and an electron injection layer (EIL) may be formed near the light-emitting layer 118. Also, various other layers may be further formed near the light-emitting layer 118 as required. In this case, the low molecular weight organic material may be copper phthalocyanine (CuPc), N'-Di(naphthalene-1-yl)-N,N'-diphenyl-benzidine (NPB), or tris-8-hydroxyquinoline aluminum (Alq3).

Also, if the light-emitting layer 118 includes a polymer organic material, an HTL may be formed near the light-emitting layer 118. The HTL may include poly-(2,4)-ethylene-dihydroxy thiophene (PEDOT) or polyaniline (PANI). In this case, the polymer organic material for forming the light-emitting layer 118 may be a poly-phenylenevinylene (PPV)-based material or a polyfluorene-based material.

An opposite electrode 119 is deposited as a common electrode on the light-emitting layer 118. In the organic light-emitting display apparatus 1 according to the present embodiment, the first pixel electrode 113 is used as an anode and the opposite electrode 119 is used as a cathode. However, in another embodiment, the first pixel electrode 113 is used as a cathode and the opposite electrode 119 is used as an anode.

The opposite electrode 119 may be a reflective electrode including a reflective material. In this case, the opposite electrode 119 may include at least one material selected from the group consisting of Al, Mg, Li, Ca, LiF/Ca, and LiF/Al. Since the opposite electrode 119 is a reflective electrode, light emitted from the light-emitting layer 118 is reflected by the opposite electrode 119, and the reflected light is emitted toward the substrate 10 through the first pixel electrode 113 formed of a transparent conductive material.

Referring to FIG. 3B, the first capacitor Cst is disposed on the substrate 10. The first capacitor Cst includes a first electrode 311c which is formed on the same plane as the semiconductor layer 211, a second electrode including a first layer 313 and a second layer 314 which is formed on the same plane as the gate electrodes 213 and 214, and a third electrode 316 which is formed on the same plane as the source and drain electrodes 216.

The first capacitor Cst is connected to the power source voltage supply line V in terms of a circuit (see FIG. 1), and the first capacitor Cst and the power source voltage supply line V overlap in terms of structure.

The first electrode 311c of the first capacitor Cst is disposed under and along the power source voltage supply line V, and may be formed of the same material as used to form the channel region 211c of the semiconductor layer 211, for example, an amorphous semiconductor or a crystalline semiconductor. A semiconductor for forming the first electrode 311c of the first capacitor Cst may not include ion impurities.

The first insulating layer 12 is formed on the first electrode 311c of the first capacitor Cst, and the first and second layers 313 and 314, respectively, of the second electrode are disposed on the first insulating layer 12, in which the first and second layers 313 and 314, respectively, of the second electrode may be formed of the same material as used to form the gate electrodes 213 and 214. The first layer 313 of the second electrode may be formed of the same transparent conductive material as used to form the first gate electrode 213, and the second layer 314 of the second electrode may be formed of the same metal as used to form the second gate electrode 214. The first and second layers 313 and 314, respectively, of the second electrode of the first capacitor Cst are disposed under and along the power source voltage supply line V.

The second insulating layer 15 is formed on the first and second layers 313 and 314, respectively, of the second electrode of the first capacitor Cst, and the third electrode 316 of the first capacitor Cst is formed on the second insulating layer 15, in which the third electrode 316 is formed of the same material as used to form the source and drain electrodes 216. The third electrode 316 is formed along the power source voltage supply line V. In this regard, the third electrode 316 contacts the first electrode 311c through a contact hole C4. Thus, in the first capacitor Cst, the capacitor Cst1 (see FIG. 2) has a first electrostatic capacity between the first electrode 311c and the second electrode including the first and second layers 313 and 314, respectively, and the capacitor Cst2 has a second electrostatic capacity between the second electrode including the first and second layers 313 and 314, respectively, and the third electrode 316. The capacitors Cst1 and Cst2 are connected in parallel. Thus, the electrostatic capacity of the first capacitor Cst may be increased.

In general, the power source voltage supply line V has a relatively wider width than the scan line S or the data line D, and may be formed of metal which has a high reflection rate or a low transmission rate. In the organic light-emitting display apparatus 1 according to the present invention, the first capacitor Cst and the power source voltage supply line V having a low transmission rate overlap. Thus, the aperture ratio of the organic light-emitting display apparatus 1 may be higher than that of an organic light-emitting display apparatus in which the first capacitor Cst is formed in a separate region in a pixel so that the first capacitor Cst and the power source voltage supply line V do not overlap.

Referring to FIG. 3B, the second capacitor Cvth is disposed on the substrate 10. The second capacitor Cvth includes a first electrode 411a formed on the same plane as the semiconductor layer 211, and a second electrode including a first layer 413 and a second layer 414, in which the first layer 413 of the second electrode is formed on the same plane as the first gate electrode 213.

The first electrode 411a of the second capacitor Cvth may include the same material used to form the semiconductor layer 211 of the first TFT TR1 of FIG. 3A. The second electrode of the second capacitor Cvth may be formed of the same transparent conductive material as used to form the first gate electrode 213 of FIG. 3A. In particular, since the first electrode 411a includes an ion impurity-doped semiconductor material, the first electrode 411a may form a metal-insulator-metal (MIM) Cap structure as the second electrode, including the first and second layers 413 and 414, respectively.

In general, a MIM Cap structure allows a constant electrostatic capacity to be maintained within a wider voltage range than a metal oxide semiconductor (MOS) Cap structure. Thus, the use of the MIM Cap structure may contribute to an improvement in a voltage margin when the circuit is constructed.

The third insulating layer 17 is formed on the third electrode 316 of the first capacitor Cst and on the second layer 414 of the second electrode of the second capacitor Cvth, and the opposite electrode 119, as a common electrode, is formed on the third insulating layer 17.

Figure 4:
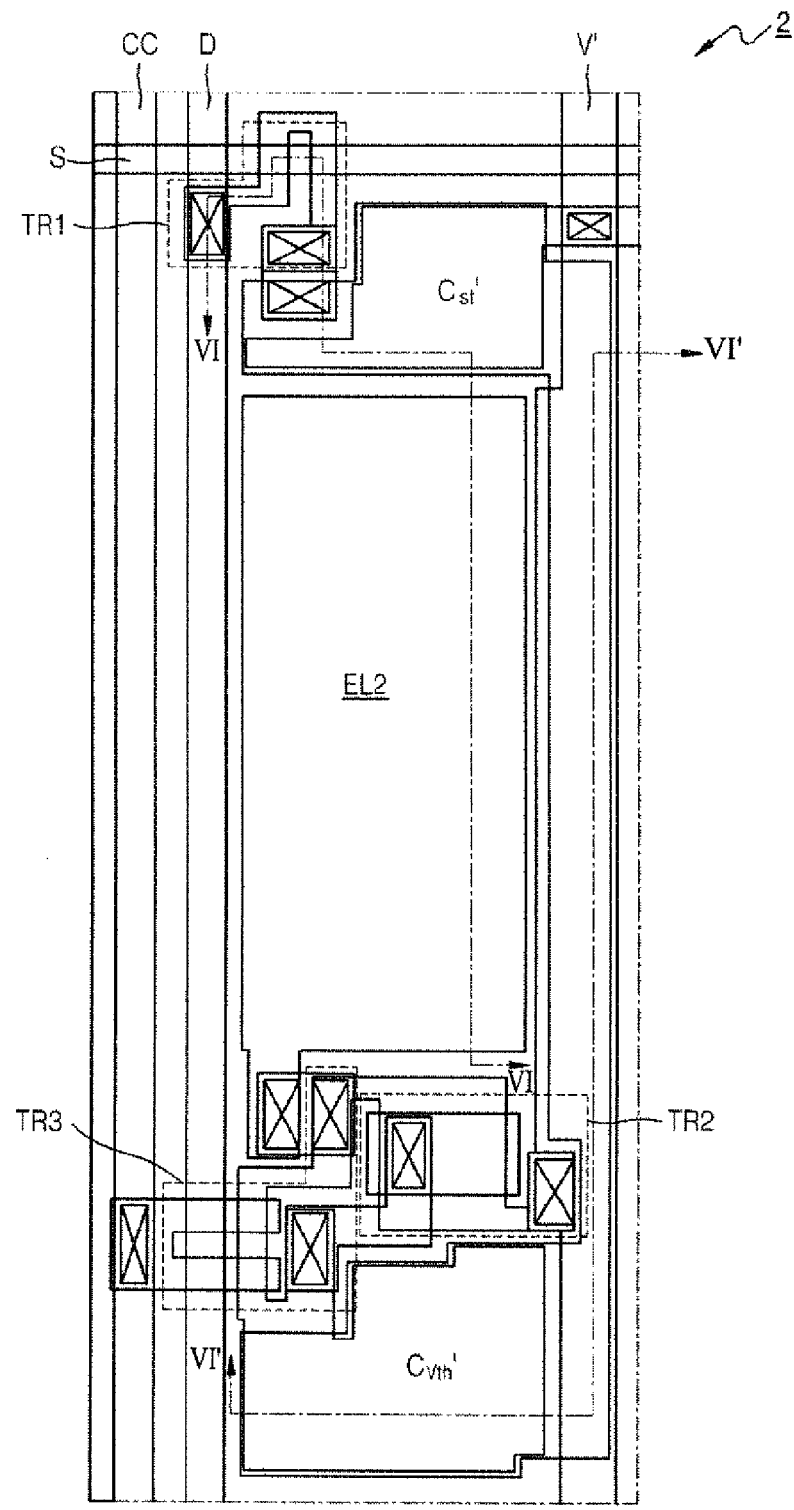
FIG. 4 is a schematic plan view of a pixel included in an organic light-emitting display apparatus used as a comparative example.

FIG. 4 is a schematic plan view of a pixel included in an organic light-emitting display apparatus used as a comparative example.

In FIG. 4, a first capacitor Cst' and a power source voltage supply V' line do not overlap, and the first capacitor Cst' is disposed in a separate region in the pixel.

Figure 5:
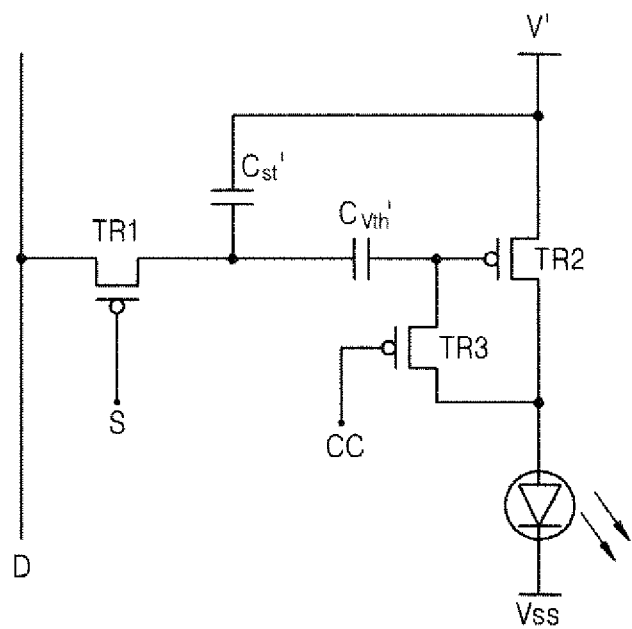
FIG. 5 is a circuit diagram of the organic light-emitting display apparatus of FIG. 4.
Figure 6A:
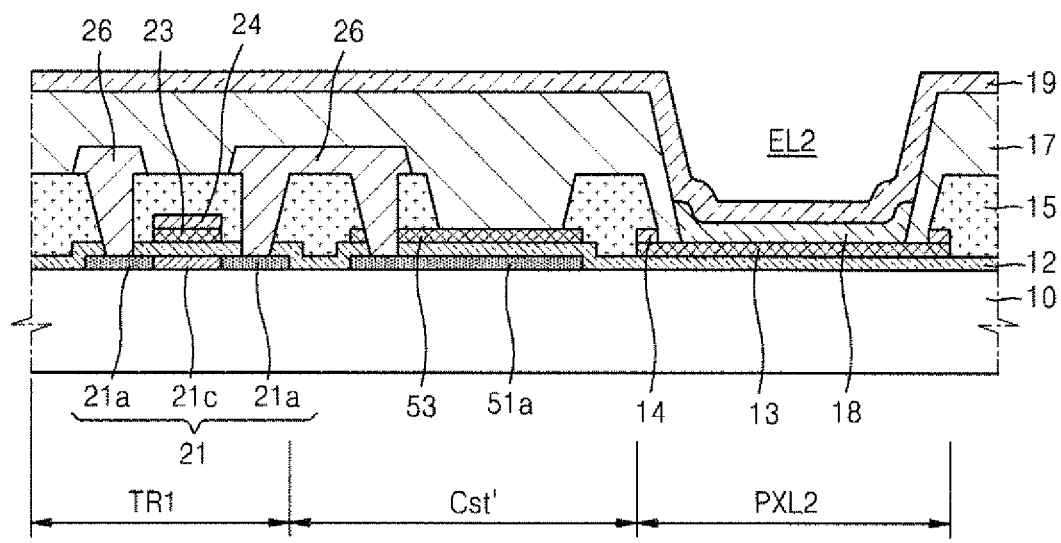
FIG. 6A is a cross-sectional view taken along a line VI-VI of FIG. 4.
Figure 6B:
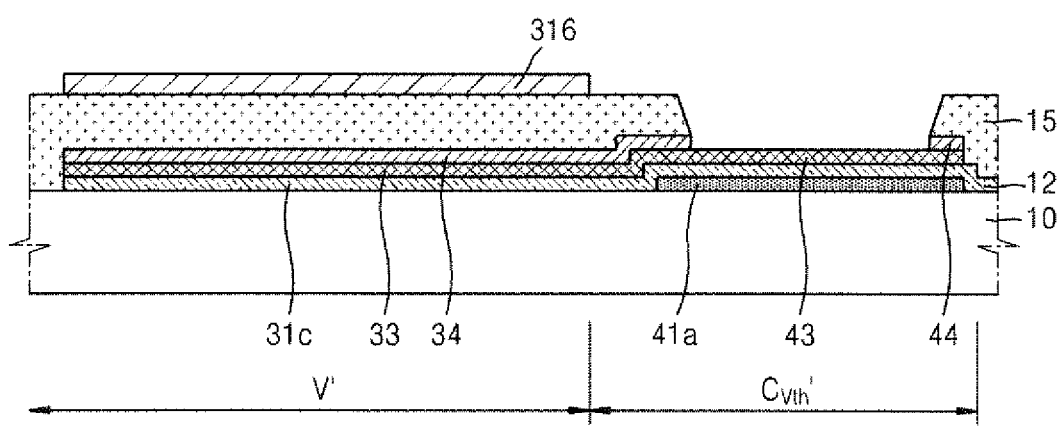
FIG. 6B is a cross-sectional view taken along a line VI'-VI' of FIG. 4.

FIG. 5 is a circuit diagram of the organic light-emitting display apparatus of FIG. 4, FIG. 6A is a cross-sectional view taken along a line VI-VI of FIG. 4, and FIG. 6B is a cross-sectional view taken along a line VI'-VI' of FIG. 4.

Referring to FIG. 4, the pixel included in the organic light-emitting display apparatus 2 as a comparative example includes a plurality of conductive lines, including a scan line S, a data line D, a power source voltage supply line V', and a compensation control signal line CC, a pixel unit including a light-emitting region EL2, first thru third TFTs TR1, TR2 and TR3, respectively, a first capacitor Cst', and a second capacitor Cvth.

Referring to FIG. 5, the organic light-emitting display apparatus 2 is different from the organic light-emitting display apparatus 1 in terms of its circuitry, in that the first capacitor Cst' as a storage capacitor and the power source voltage supply line V' are not disposed in parallel, that is, the first capacitor Cst' is disposed separately.

Referring to FIG. 6A, the first TFT TR1, the first capacitor Cst', and the pixel unit PXL2 are disposed on the substrate 10. The first TFT TR1 includes a semiconductor layer 21, first and second gate electrodes 23 and 24, respectively, and source and drain electrodes 26. The pixel unit PXL2 includes a pixel electrode 13, a light-emitting layer 18, and an opposite electrode 19.

The pixel electrode 13 and the first gate electrode 23 are formed on the same plane, and are formed of the same transparent conductive material. The light-emitting layer 18 is formed on the pixel electrode 13, and light emitted from the light-emitting layer 18 propagates toward the substrate 10 through the first pixel electrode 13 formed of the transparent conductive material.

The first capacitor Cst', as a storage capacitor, is disposed between the pixel unit PXL2 and the first TFT TR1. In the organic light-emitting display apparatus 2, the first capacitor Cst' includes a first electrode 51a formed on the same plane as the semiconductor layer 21 and a second electrode 53 formed on the same plane as the first gate electrode 23. In this case, the first electrode 51a may include an ion impurity-doped semiconductor material, and may form a MIM Cap structure as the second electrode 53. The formed MIM Cap structure has overall a low transmission rate, and thus it is difficult for light emitted from the light-emitting layer 18 to pass through the MIM Cap structure. Accordingly, the light-emitting region EL2 determined according to the light-emitting layer 18 is narrower than the light-emitting region EL1 of the organic light-emitting display apparatus 1 according to the previous embodiment, thereby decreasing the aperture ratio.

Referring to FIG. 6B, the power source voltage supply line V' and the second capacitor Cvth' are disposed on the substrate 10.

The power source voltage supply line V' includes a first layer 33 formed of the same material as used to form the first gate electrode 13, and a second layer 34 formed of the same material as used to form the second gate electrode 14, in which the first layer 33 and the second layer 34 are formed on the first insulating layer 12. A second insulating layer 15 may be formed on the first layer 33 and the second layer 34. The power source voltage supply line V' may further include a third layer 36 which is formed on the second insulating layer 15, and which is formed of the same material as used to form the source and drain electrodes 26.

The second capacitor Cvth includes a first electrode 41a formed on the same plane as the semiconductor layer 21 and a second electrode 43 formed on the same plane as the first gate electrode 23. The first electrode 41a of the second capacitor Cvth' may include the same material as used to form the semiconductor layer 21 of the first TFT TR1. The second electrode 43 of the second capacitor Cvth' maybe formed of the same transparent conductive material as used to form the first gate electrode 23. In particular, the first electrode 41a includes an ion impurity-doped semiconductor material and forms a MIM Cap structure as the second electrode 43.

Thus, since in the organic light-emitting display apparatus 2, the first capacitor Cst' is formed in a separate region of the pixel so that the first capacitor Cst' and the power source voltage supply line V' do not overlap, the light-emitting region EL2 determined according to the light-emitting layer 18 is narrow. Thus, the aperture ratio is decreased.

FIGS. 7A thru 11B are schematic cross-sectional views for explaining a method of manufacturing an organic light-emitting display apparatus according to an embodiment of the present invention.

Figure 7A:
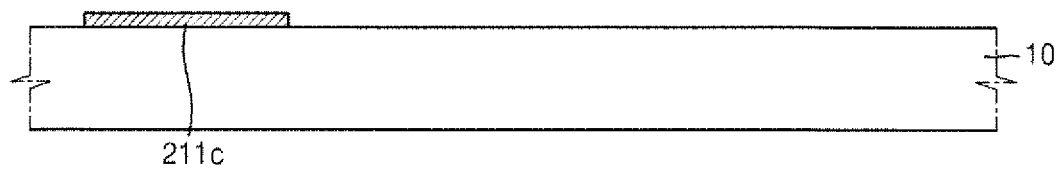
FIGS. 7A thru 11B are schematic cross-sectional views for explaining a method of manufacturing an organic light-emitting display apparatus according to an embodiment of the present invention.
Figure 7B:
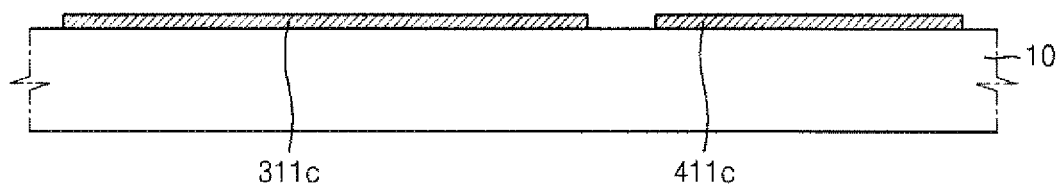

In particular, FIGS. 7A and 7B are schematic cross-sectional views illustrating results of a first mask process performed on the organic light-emitting display apparatus 1.

Referring to FIG. 7A, a portion 211c of the semiconductor layer 211 of the first TFT TR1 of FIG. 3A is formed on the substrate 10, and referring to FIG. 7B, the first electrode 311c of the first capacitor Cst and a first electrode 411c of the second capacitor Cvth are formed on the substrate 10.

Although not illustrated in FIGS. 7A and 7B, a material for forming a semiconductor layer (not shown) is deposited on the substrate 10, and a photoresist (not shown) is coated on the material for forming a semiconductor layer. By performing a photolithography process using a first photo mask (not shown), the material for forming a semiconductor layer is patterned to form the semiconductor layer 211 of the first TFT TR1, the first electrode 311c of the first capacitor Cst, and the first electrode 411c of the second capacitor Cvth. Although not illustrated in FIGS. 7A and 7B, the second TFT TR2 and the third TFT TR3 may be formed by using the same method as used to form the first TFT TR1.

In the first mask process performed by photolithography, the first photo mask is exposed to light emitted from an exposure device (not shown), and then a series of processes, including developing, etching, and stripping or ashing, are performed thereon.

The semiconductor layer 211 may include amorphous silicon or poly silicon. Also, the semiconductor layer 211 may be formed by crystallizing poly silicon into amorphous silicon. The crystallizing of amorphous silicon may be performed by, for example, rapid thermal annealing (RTA), solid phase crystallization (SPC), excimer laser annealing (ELA), metal induced crystallization (MIC), metal induced lateral crystallization (MILC), or sequential lateral solidification (SLS).

Figure 8A:
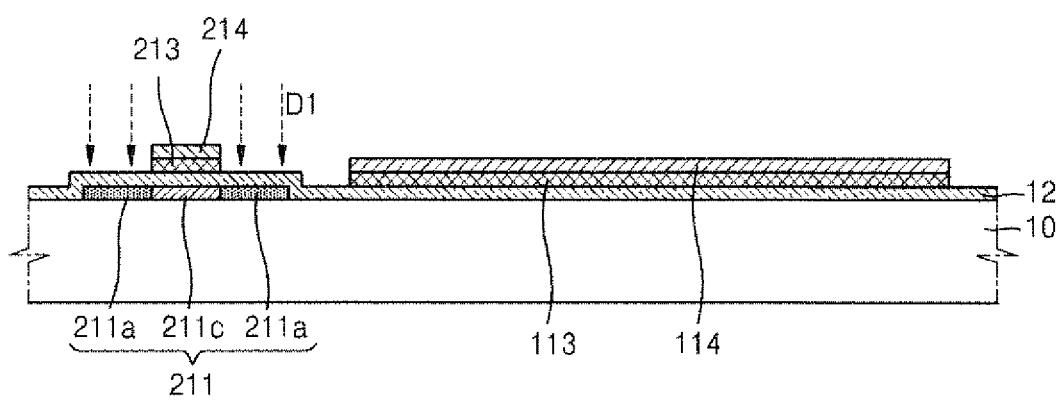
Figure 8B:
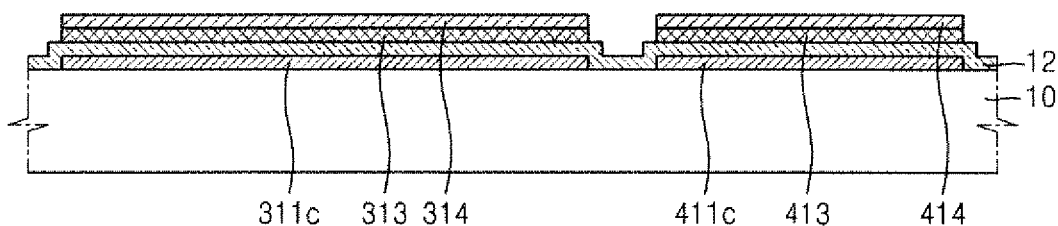

FIGS. 8A and 8B are schematic cross-sectional views illustrating results of a second mask process performed on the organic light-emitting display apparatus 1.

Referring to FIG. 8A, the first insulating layer 12 is deposited on the resultant structure of the first mask process illustrated in FIG. 7A, and the first gate electrode 213 and the second gate electrode 214 are sequentially deposited on the first insulating layer 12. Regarding the pixel unit PXL1, the first pixel electrode 113 and the second pixel electrode 114 are sequentially deposited on the first insulating layer 12.

Referring to FIG. 8B, the first insulating layer 12 is deposited on the resultant structure of the first mask process illustrated in FIG. 7B, and the first gate electrode 213 and the second gate electrode 214 are sequentially deposited on the first insulating layer 12. Regarding the second capacitor Cvth, the first and second layers 413 and 414, respectively, of the second electrode are sequentially deposited on the first insulating layer 12.

The first gate electrode 213, the first pixel electrode 113, the first layer 313 of the second electrode of the first capacitor Cst, and the first layer 413 of the second electrode of the second capacitor Cvth may be simultaneously formed on the same plane, and may be formed of the same transparent conductive material selected from the group consisting of ITO, IZO, ZnO and $In_2O_3$.

The second gate electrode 214, the second pixel electrode 114, the second layer 314 of the second electrode of the first capacitor Cst, and the second layer 414 of the second electrode of the second capacitor Cvth maybe simultaneously formed on the same plane, and may be formed of at least one selected from the group consisting of Ti, Mo, Al, Ag, Cu and alloys thereof.

An ion impurity is doped on the resultant structures (D1). The ion impurity used for doping may be an ion of a Group 3 element and a Group 5 element, the concentration of the ion impurity may be equal to or greater than $1 \times 10^{15}$ atoms/cm$^2$, and the doping may be performed on the semiconductor layer 211 of the first TFT TR1.

In this regard, an ion impurity is doped on the semiconductor layer 211 by using the first and second gate electrodes 213 and 214, respectively, as a self aligning mask, and thus the semiconductor layer 211 includes the source and drain regions 212a doped with ion impurities and the channel region 212c interposed between the source and drain regions 212a. That is, since the first and second gate electrodes 213 and 214, respectively, are used as a self aligning mask, the source and drain regions 212a may be formed without use of a separate photo mask.

Figure 9A:
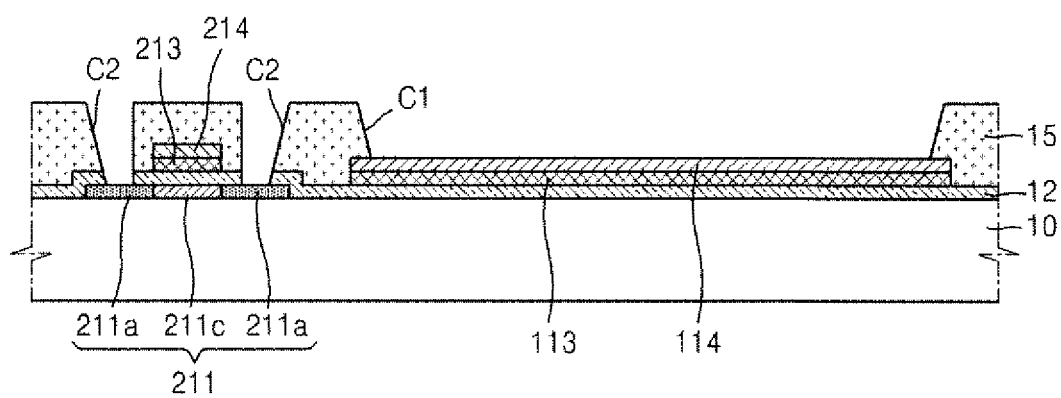
Figure 9B:
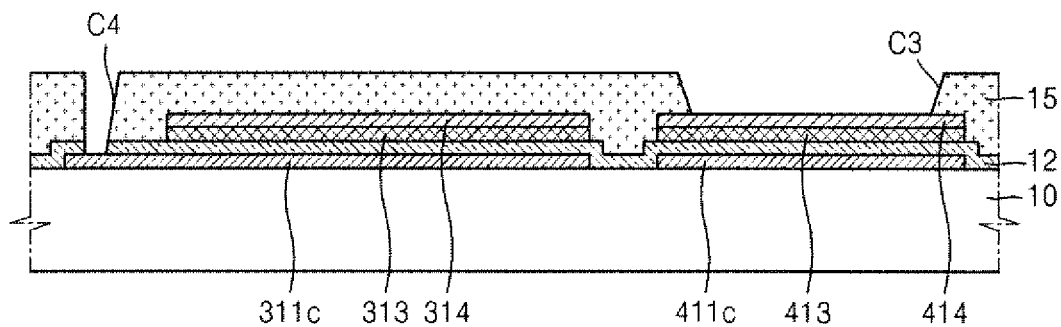

FIGS. 9A and 9B are schematic cross-sectional views illustrating results of a third mask process performed on the organic light-emitting display apparatus 1.

Referring to FIGS. 9A and 9B, the second insulating layer 15 is deposited on the resultant structure of the second mask process of FIGS. 8A and 8B, and the second insulating layer 15 is patterned to form a first contact hole C1 exposing an upper surface of the second pixel electrode 114, a second contact hole C2 exposing portions of the source and drain regions 211a of the semiconductor layer 211, a third contact hole C3 exposing an upper surface of the second layer 314 of the second electrode of the second capacitor Cvth, and a fourth contact hole C4 exposing a portion of the first electrode 311c of the first capacitor Cst.

Figure 10A:
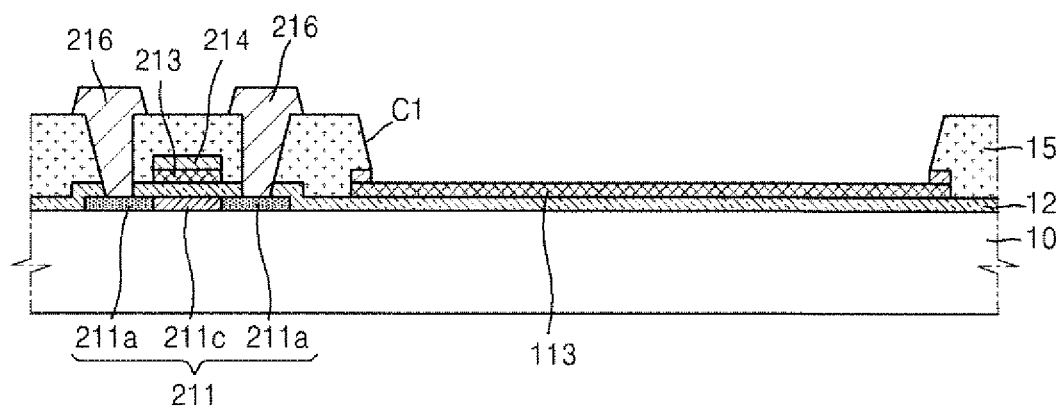
Figure 10B:
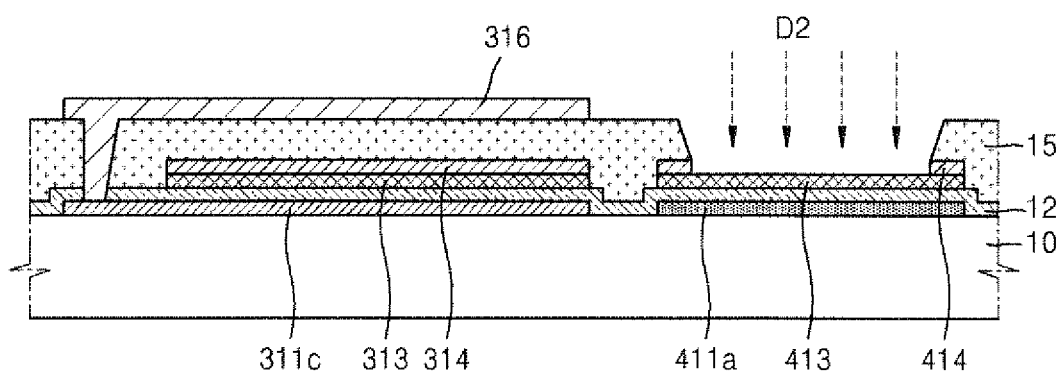

FIGS. 10A and 10B are schematic cross-sectional views illustrating results of a fourth mask process performed on the organic light-emitting display apparatus 1.

Referring to FIG. 10A, the source and drain electrodes 216 respectively contacting the source and drain regions 211a are formed on the resultant structure of the third mask process illustrated in FIG. 9A, and a portion of the second pixel electrode 114 of the pixel unit PXL1 is removed.

Referring to FIG. 10B, the third electrode 316 of the first capacitor Cst contacting the first electrode 311c of the first capacitor Cst is formed on the resultant structure of the third mask process illustrated in FIG. 9B, and a portion of the second layer 414 of the second electrode of the second capacitor Cvth is removed.

The fourth mask process may include a first etching process, and a second etching process following the first etching process. In the first etching process, a conductive material for forming the source and drain electrodes 216 deposited on the second pixel electrode 114 and the second layer 414 of the second electrode of the second capacitor Cvth is etched. In the second etching process, the second pixel electrode 114, and the second layer 414 of the second electrode of the second capacitor Cvth, are removed. Such separation of an etching process may be required when a material for forming the second pixel electrode 114 and the second layer 414 of the second electrode of the second capacitor Cvth is different from a material for forming the source and drain electrodes 216. If a material for forming the second pixel electrode 114 and the second layer 414 of the second electrode of the second capacitor Cvth and a material for forming the source and drain electrodes 216 are the same, one etching process is possible.

Following the fourth mask process, the resultant structure (D2) is doped with ion impurities. As described above, ion impurities used for doping may be ions of a Group 3 element and a Group 5 element, the concentration of the ion impurities may be equal to or greater than $1 \times 10^{15}$ atoms/cm$^2$, and the doping may be performed on the first electrode 411c of the second capacitor Cvth.

Since the first layer 413 of the second electrode of the second capacitor Cvth has a thickness of 1000 Å or less, ion impurities may pass through the first layer 413 and may be doped on the first electrode 411c. As a result, the ion impurity-doped first electrode 411a forms a MIM Cap structure as the second layer 414 of the second electrode of the second capacitor Cvth, thereby improving a voltage margin when a circuit is constructed.

Also, the first electrode 311c of the first capacitor Cst is not doped with ion impurities since the second layer 314 of the second electrode and the third electrode 316 formed on the first electrode 311c have a great thickness, and thus act as a shielding layer.

Figure 11A:
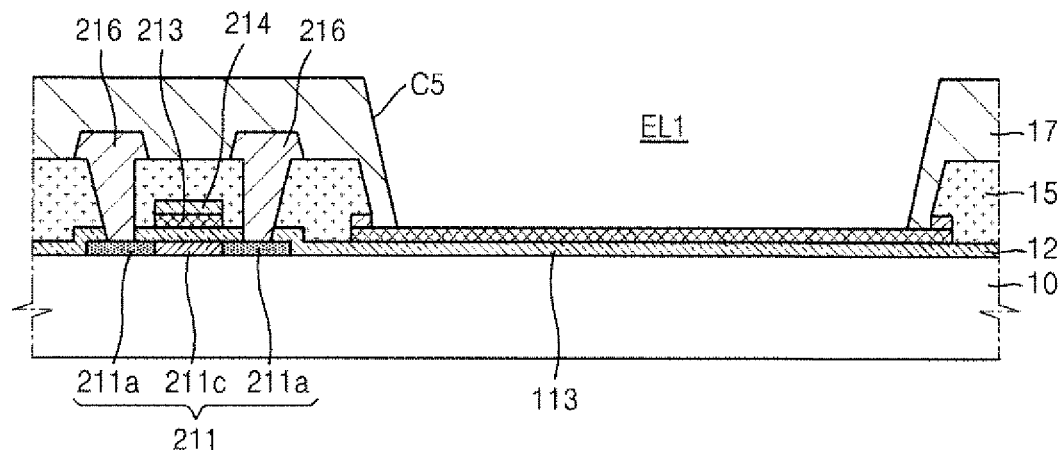
Figure 11B:
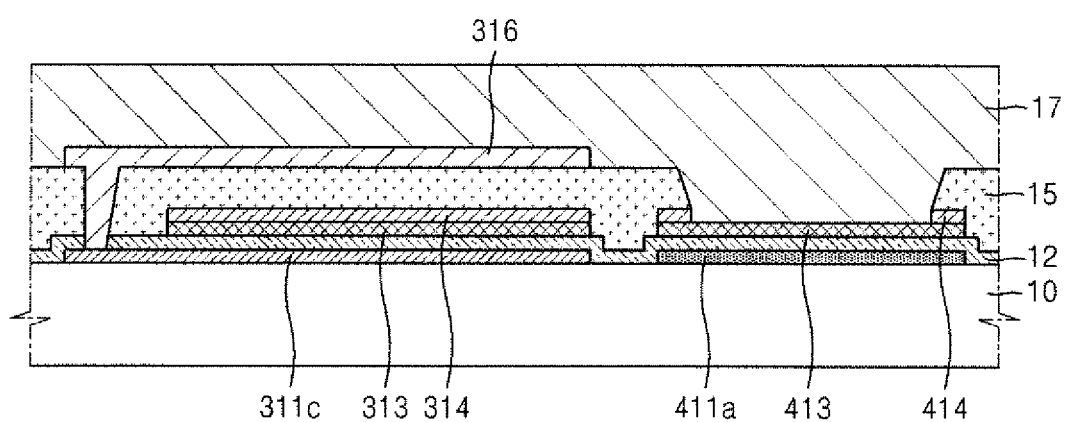

FIGS. 11A and 11B are schematic cross-sectional views illustrating results of a fifth mask process performed on the organic light-emitting display apparatus 1.

Referring to FIGS. 11A and 11B, the third insulating layer 17 is formed on the resultant structures of the fourth mask process illustrated in FIGS. 10A and 10B, and an opening C5 exposing an upper surface of the first pixel electrode 113 is formed.

The light-emitting layer 118 (see FIG. 3A) is formed inside the opening C5, and when a voltage is applied to the light-emitting layer 118 by the first pixel electrode 113 and the opposite electrode 119 (see FIG. 3A), the light-emitting layer 118 emits light. Accordingly, the light-emitting region EL1 is widened and the aperture ratio is increased.

An organic light-emitting display apparatus and a method of manufacturing the same, according to the above embodiments of the present invention provide the following effects.

First, a storage capacitor and a power source voltage supply line overlap, and thus a light-emitting region is widened and an aperture ratio is increased.

Second, the storage capacitor and the power source voltage supply line are connected in parallel, and thus an electrostatic capacity may be improved.

Third, a compensation capacitor has a MIM Cap structure, and thus a voltage margin for a circuit may be improved.

Fourth, an organic light-emitting display apparatus having the above effects may be manufactured by performing a mask process five times.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. An organic light-emitting display apparatus, comprising:
    at least one transistor, each comprising a semiconductor layer, a gate electrode and source and drain electrodes;
    a first capacitor including a first electrode formed coplanar with the semiconductor layer, a second electrode formed on a same plane as the gate electrode, and a third electrode formed on a same plane as the source and drain electrodes, the first electrode of the first capacitor comprising a semiconductor which is not doped with ion impurities;
    a second capacitor including a first electrode formed coplanar with the semiconductor layer and a second electrode formed on the same plane as the gate electrode, a portion of the first electrode of the second capacitor, which overlaps an insulating layer interposed between the first and second electrodes of the second capacitor and which overlaps the second electrode of the second capacitor, comprising ion impurities, the second electrode of the second capacitor including a second layer and a first layer disposed between the insulating layer and the second layer of the second electrode of the second capacitor, a center portion of the second layer of the second electrode of the second capacitor including an opening exposing a center portion of the first layer of the second electrode of the second capacitor;
    a pixel electrode formed on the same plane as the gate electrode and electrically connected to said at least one transistor;
    a light-emitting layer disposed on the pixel electrode; and
    an opposite electrode disposed on the light-emitting layer and facing the pixel electrode.

2. The organic light-emitting display apparatus of claim 1, wherein the first capacitor is electrically connected to a power source voltage supply line for supplying a power source voltage to said at least one transistor, and the first capacitor and the power source voltage supply line overlap each other by forming the first capacitor in a region where the power source voltage supply line extends.

3. The organic light-emitting display apparatus of claim 2, wherein the transistor is a driving transistor and the first capacitor is a storage capacitor for applying a voltage to the driving transistor.

4. The organic light-emitting display apparatus of claim 1, wherein the first electrode of the first capacitor and the third electrode of the first capacitor are electrically connected to each other through a contact hole.

5. The organic light-emitting display apparatus of claim 4, wherein the first capacitor has a first electrostatic capacity between the first electrode and the second electrode of the first capacitor, and a second electrostatic capacity between the second electrode and the third electrode of the first capacitor, and wherein the first electrostatic capacity and the second electrostatic capacity are connected in parallel.

6. The organic light-emitting display apparatus of claim 1, wherein the second electrode of the first capacitor comprises a same material as used to form the gate electrode.

7. The organic light-emitting display apparatus of claim 1, wherein the third electrode of the first capacitor comprises a same material as used to form the source and drain electrodes.

8. The organic light-emitting display apparatus of claim 7, wherein the third electrode of the first capacitor comprises a power source voltage supply line for supplying a power source voltage to the transistor.

9. The organic light-emitting display apparatus of claim 1, wherein the second capacitor is a compensation capacitor which is connected to a gate terminal of a driving transistor.

10. The organic light-emitting display apparatus of claim 1, wherein the second electrode of the second capacitor comprises a transparent conductive material.

11. The organic light-emitting display apparatus of claim 1, wherein the gate electrode comprises a first layer including a transparent conductive material and a second layer including metal.

12. The organic light-emitting display apparatus of claim 1, wherein the pixel electrode comprises a same transparent conductive material as used to form the gate electrode.

13. The organic light-emitting display apparatus of claim 1, wherein the semiconductor layer comprises one of amorphous silicon and poly silicon.

14. The organic light-emitting display apparatus of claim 1, wherein the opposite electrode is a reflective electrode which reflects light emitted from the light-emitting layer.

* * * * *